US009743560B2

(12) United States Patent
Chen

(10) Patent No.: US 9,743,560 B2
(45) Date of Patent: Aug. 22, 2017

(54) COMPUTER ROOM, DATA CENTER, AND DATA CENTER SYSTEM

(71) Applicant: Alibaba Group Holding Limited, Grand Cayman (KY)

(72) Inventor: Yanchang Chen, Hangzhou (CN)

(73) Assignee: Alibaba Group Holding Limited, Grand Cayman (KY)

( * ) Notice: Subject to any disclaimer, the term of this patent is extended or adjusted under 35 U.S.C. 154(b) by 29 days.

(21) Appl. No.: 14/829,145

(22) Filed: Aug. 18, 2015

(65) Prior Publication Data
US 2016/0057894 A1 Feb. 25, 2016

(30) Foreign Application Priority Data
Aug. 19, 2014 (CN) .......................... 2014 1 0409587

(51) Int. Cl.
H05K 7/20 (2006.01)
H05K 7/14 (2006.01)

(52) U.S. Cl.
CPC ....... H05K 7/20745 (2013.01); H05K 7/1497 (2013.01)

(58) Field of Classification Search
CPC .... H05K 7/1497; H05K 7/20745; H05K 7/20; H05K 7/20127; H05K 7/20136; H05K 7/20145; H05K 7/202; H05K 7/20554; H05K 7/2059; H05K 7/20709; E04H 1/06; E04H 2005/005; E04H 5/02; E04H 5/04;
(Continued)

(56) References Cited

U.S. PATENT DOCUMENTS 6,896,612 B1 * 5/2005 Novotny ............ H05K 7/20618
361/691
8,218,322 B2 7/2012 Clidaras et al.
2006/0015841 A1 1/2006 Bishop et al.
(Continued)

FOREIGN PATENT DOCUMENTS

CN 201080067873.4 A 3/2013
GB WO 2013021182 A1 * 2/2013 ............ E04B 1/343
(Continued)

OTHER PUBLICATIONS

PCT Search Report and Written Opinion mailed Nov. 24, 2015 for PCT Application No. PCT/US15/45690, 13 pages.

*Primary Examiner* — Anthony Haughton
*Assistant Examiner* — Yahya Ahmad
(74) *Attorney, Agent, or Firm* — Lee & Hayes, PLLC

(57) ABSTRACT

A data center system includes an infrastructure unit including a public area and a bridge area and at least one computer room. The computer room is disposed along an extending direction of the bridge area, and a length of the bridge area is matched with a length of computer rooms arranged along the bridge area, so that a number of computer rooms may be increased according to the needs. The computer room includes a plurality of layers of data centers stacked on each other. Cold passage areas and hot passage areas of two neighboring layers of data centers form a cold air passage and a hot air passage so that cold air produced by a cooling module may be directed to each data center, and hot air in each data center may be directed to the cooling module to enable devices in each data center to operate under appropriate temperature.

20 Claims, 13 Drawing Sheets

(58) Field of Classification Search
CPC ......... E04H 5/10; F24F 2007/004; F24F 7/06;
F24F 7/08; F24F 7/10
USPC ......... 361/679.47–679.5, 690–695; 454/185,
454/186, 231, 232; 165/185
See application file for complete search history.

(56) References Cited

U.S. PATENT DOCUMENTS

| | | | |
|---|---|---|---|
| 2009/0241578 A1* | 10/2009 | Carlson | F25D 17/06 62/259.2 |
| 2009/0251860 A1* | 10/2009 | Belady | H05K 7/20745 361/690 |
| 2011/0138708 A1* | 6/2011 | Chazelle | E04H 1/06 52/173.1 |
| 2012/0152777 A1* | 6/2012 | Lin | H05K 7/20745 206/320 |
| 2012/0162906 A1 | 6/2012 | Jai | |
| 2012/0173894 A1* | 7/2012 | Driggers | G06F 1/183 713/300 |
| 2012/0200206 A1 | 8/2012 | Schmitt et al. | |
| 2013/0094136 A1 | 4/2013 | Gross et al. | |
| 2013/0103218 A1 | 4/2013 | Das et al. | |
| 2013/0232888 A1 | 9/2013 | Crosby, Jr. | |
| 2013/0340361 A1 | 12/2013 | Rogers | |
| 2014/0157692 A1* | 6/2014 | Parizeau | E04H 1/005 52/173.1 |
| 2014/0268530 A1* | 9/2014 | Roy | H05K 7/20827 361/679.5 |
| 2015/0305208 A1* | 10/2015 | Rogers | H05K 7/20745 165/80.3 |
| 2015/0342094 A1* | 11/2015 | Ross | H05K 7/20745 361/679.46 |
| 2016/0021793 A1* | 1/2016 | Chen | H05K 7/20827 361/679.47 |
| 2016/0057894 A1* | 2/2016 | Chen | H05K 7/20745 361/679.47 |

FOREIGN PATENT DOCUMENTS

| | | |
|---|---|---|
| WO | WO2012/008945 A1 | 1/2012 |
| WO | WO2013021182 | 2/2013 |

* cited by examiner

US 9,743,560 B2

COMPUTER ROOM, DATA CENTER, AND DATA CENTER SYSTEM

CROSS-REFERENCE TO RELATED PATENT APPLICATION

This application claims foreign priority to Chinese Patent Application No. 201410409587.1 filed on 19 Aug. 2014, entitled "Computer Room, Data Center, and Data Center System", which is hereby incorporated by reference in its entirety.

TECHNICAL FIELD

The present disclosure relates to the technical field of data centers, and, more particularly, to a computer room, a data center, and a data center system.

BACKGROUND

With the rapid development of the electronics industry and the constant development of communication technologies, the application and management mode of information technology (IT) has gradually developed from a separate and discrete set of functional resources into an operation mode that uses a data center as a main working platform. The data center generally includes a server rack, an air conditioning system, a power distribution device, and an uninterruptible power supply (UPS), and forms a centralized computing facility in the form of a computer room together with a building or container that accommodates the above components.

Although container data centers provide a more timely solution according to use requirements, such container data centers only save capital expenditures at an initial stage considering a long-term use. Moreover, they are only suitable for an instant application solution and may no longer be suitable for subsequent application solutions after a period of time and therefore need to be replaced, which results in a waste of resources.

A data center that uses a building as a structural appearance may be designed and constructed according to specific needs of customers. Such a physical data center has a long construction period. Generally, it takes several months to one year from feasibility study to concept design, preliminary design, solution design, detailed design and construction design. The construction of the building takes about half a year; and the supply, connection and installation, and commissioning of each electro-mechanical device in the data center take another three to four months. Thus the overall construction of the data center needs to take 1 to 2 years. If several data center projects are started at the same time and each project has a special design, an enterprise has to spend a lot of time and labor on the management and implementation of the projects.

Furthermore, since there is a limitation on the data processing amount in the initial stage, after the construction of such physical data center is finished, generally it is impossible or difficult to expand the number of buildings for accommodating server racks according to the use needs; and feasibility assessment, design and construction procedures must be carried out again for the buildings (for example, infrastructure facilities such as an office area and a general device area, a main computer room for placing server racks, and facilities such as a connecting passage between the infrastructure facilities and the main computer room), the power distribution facility and the cooling facility of the data center, which causes long time for construction of the data center and limits the flexibility of the data center in use.

In addition, with the rapid development of the information industry, requirements for various hardware are changing constantly. The existing physical data center is built based on a configuration solution of buildings and electro-mechanical systems, and a delivery is completed after IT devices are deployed. Therefore, upon the completion, the existing architecture may not be flexibly compatible with multiple power distribution technologies and evolution of different densities of server racks, and may not switch between different data center availability tiers according to the use needs.

Meanwhile, the current cooling mode of data centers is mainly based on room-level precision air conditioners or row-level precision air conditioners. Such cooling devices usually have a small capacity that is not sufficient for use, and the chilled water system and delivery pipes have a complex design which cannot be easily deployed. In case of a large-scale air handling unit (AHU), although it has a simple and efficient cooling system, it generally has to be placed at the top layer of the building or on two sides of the building, which causes that its cooling design may satisfy only data centers on a single floor in the computer room (that is, disposed at a same horizontal position) and may not provide a cooling function for data centers that are distributed on different floors (that is, at different horizontal positions); therefore, it is not suitable to use a stack form as the layout pattern of the data centers in the computer room to accommodate more server racks, and limits the data processing amount and the processing performance of the data center.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter. The term "technique(s) or technical solution(s)" for instance, may refer to apparatus(s), system(s), method(s) and/or computer-readable instructions as permitted by the context above and throughout the present disclosure.

According to one perspective of the present disclosure, there is provided a computer room, a data center, and a data center system, in which, by a configuration of a cold passage area and a hot passage area in the data center, a vertically distributed cold air passage and hot air passage are formed in the computer room when multiple layers of data centers are stacked on each other, so that a cooling module may perform a cooling circulation in the computer room through the cold air passage and the hot air passage, thereby solving the problem that generally a data center of a computer room is only placed in a single-layer form due to the limited performance of the cooling device and thus a data processing amount and a processing performance are limited.

An embodiment of the present disclosure discloses a computer room, including a plurality of layers of data centers, each layer of the data centers including a main computer room area, a cold passage area, a hot passage area, and a plurality of hollow structures. The main computer room area includes a separation plate; and the separation plate which has an opening is disposed along a horizontal direction of the main computer room area, wherein the separation plate separates the main computer room area into an accommodation space at a lower layer and an air exhaust passage at an upper layer; and the accommodation space is in connection with the air exhaust passage through the opening. The cold passage area is disposed on one side of the main computer room area, and is in connection with the accommodation space. The hot passage area is disposed on the other side of the main computer room area, and the hot passage area is in connection with the air exhaust passage and is isolated from the cold passage area. The plurality of hollow structures corresponds to the cold passage area and the hot passage area respectively. The cold passage areas of two neighboring layers of data centers are in connection with each other through the corresponding hollow structures, which forms a cold air passage running through the plurality of layers of data centers in the computer room; and the hot passage areas of two neighboring layers of data centers are in connection with each other through the corresponding hollow structures, which forms a hot air passage running through the plurality of layers of data centers in the computer room.

Another embodiment of the present disclosure further discloses a data center, including a main computer room area, a cold passage area, a hot passage area, and a plurality of hollow structures. The main computer room area is equipped with a separation plate, and the separation plate which has an opening is disposed along a horizontal direction in the main computer room area, wherein the separation plate separates the main computer room area into an accommodation space at a lower layer and an air exhaust passage at an upper layer; and the accommodation space is in connection with the air exhaust passage through the opening. The cold passage area is disposed on one side of the main computer room area, and is in connection with the accommodation space. The hot passage area is disposed on the other side of the main computer room area, and the hot passage area is in connection with the air exhaust passage and is isolated from the cold passage area. The plurality of hollow structures corresponds to the cold passage area and the hot passage area respectively. When a plurality of data centers are stacked on each other, cold passage areas of two neighboring data centers are in connection with each other through the corresponding hollow structures which forms a cold air passage running through the plurality of data centers, and hot passage areas of two neighboring data centers are in connection with each other through the corresponding hollow structures which forms a hot air passage running through the plurality of data centers.

Still another embodiment of the present disclosure further discloses a data center system, including an infrastructure unit and at least one computer room. The infrastructure unit includes a public area and a bridge area. One side of the bridge area is connected to the public area, and the other side of the bridge area extends toward a direction away from the public area. The computer room is disposed along an extending direction of the bridge area, and connected to the bridge area. The computer room includes a plurality of layers of data centers, and a cold air passage and a hot air passage that run through the plurality of layers of data centers respectively. A length of the bridge area is matched with a length of computer rooms arranged along the bridge area; and in an initial state, the length of the bridge area is at least the length of N+1 computer rooms arranged along the bridge area, wherein N is the number of computer rooms that are disposed in the initial state.

Compared with conventional techniques, embodiments of the present disclosure achieves the following technical effects:

In the computer room and the data center provided by embodiments of the present disclosure, by the vertical distribution of the cold air passage and the hot air passage in the computer room, the cooling module, after in connection with the cold air passage and the hot air passage, is able to provide a vertical cooling circulation mode in the computer room, providing a cooling function for devices in the layers of data centers that are stacked on each other, which not only enables the computer room to configure different numbers of layers of data centers according to the needs to expand the number of server racks, but also deploys the cooling module in the computer room having a plurality of layers of data center structures, thereby solving the problem that a cooling module generally is not suitable for use in a computer room having a plurality of layers of data center structures.

Furthermore, in the data center system provide by embodiments of the present disclosure, by using the bridge area as an area for expanding the computer rooms, the number of computer rooms disposed in the data center system may be expanded along the extending direction of the bridge area according to the use needs, thereby solving the problem that the number of computer rooms generally may not be expanded once the construction of a data center is finished.

BRIEF DESCRIPTION OF THE DRAWINGS

The drawings described herein are used for providing a further understanding of the present disclosure, and constitute a part of the application. The example embodiments of the present disclosure and the description thereof are used for illustrating the present disclosure and are not intended to impose limitation to the present disclosure.

DETAILED DESCRIPTION

The implementation of the present disclosure will be described in detail below with reference to the accompanying drawings and example embodiments so that the implementation process of how the present disclosure uses the technical solutions to solve the technical problem and achieve the technical effect may be understood and implemented.

Certain terms are used throughout the specification and claims, which refer to particular components. As one skilled in the art will appreciate, hardware manufacturers may refer to a component by different names. The specification and claims do not intend to distinguish between components that differ in name. Instead the components are distinguished based on their functions. As mentioned throughout the specification and claims, the term "include" is used in an open-ended fashion, and thus should be interpreted to mean "including, but not limited to". The "substantially" refers to in an acceptable error range, and those skilled in the art may solve the technical problem and substantially achieve the technical effect in a certain error range. Moreover, the terms "couple" and "electrically connection" herein include either a direct or an indirect electrical coupling solution. Thus, if a first apparatus couples to a second apparatus herein, it indicates that the first apparatus may couple to the second apparatus through a direct electrical coupling, or through an indirect electrical coupling via other apparatus and coupling solutions. The example embodiments for implementing the present disclosure are described in the specification as following, but the description is still only for the purpose of explaining the general principle of the present disclosure and is not intended to limit the scope of the present disclosure. The protection scope of the present disclosure shall be as defined in the claims of the present disclosure.

It should be noted that the term "including," "comprising," or any variation thereof refers to non-exclusive inclusion so that a process, method, product, or device that includes a plurality of elements does not only include the plurality of elements but also any other element that is not expressly listed, or any element that is essential or inherent for such process, method, product, or device. Without more restriction, the elements defined by the phrase "including a . . . " does not exclude that the process, method, product, or device includes another same element in addition to the elements.

Description of the Example Embodiments

Figure 1:
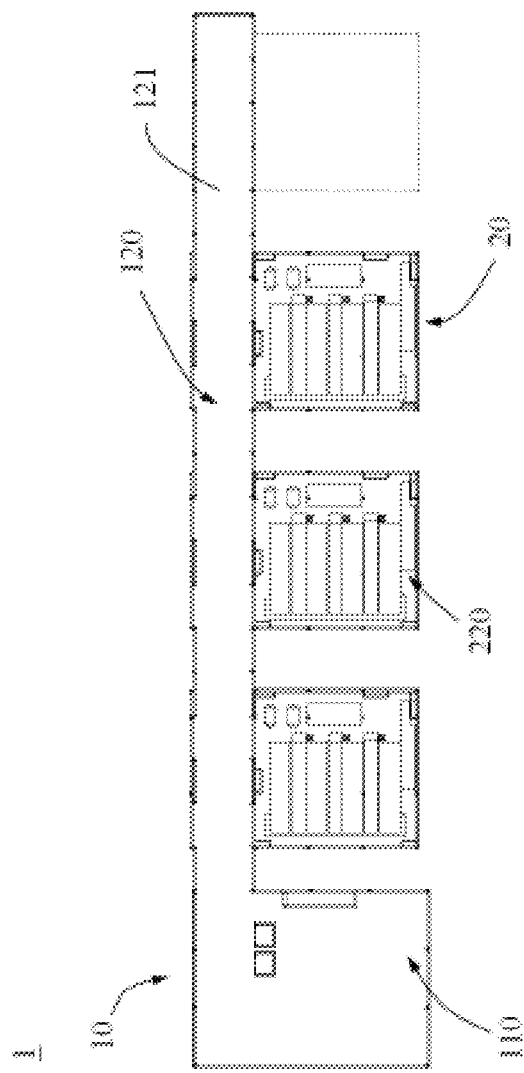
FIG. 1 is a schematic top view of an example data center system according to a first example embodiment of the present disclosure.
Figure 2:
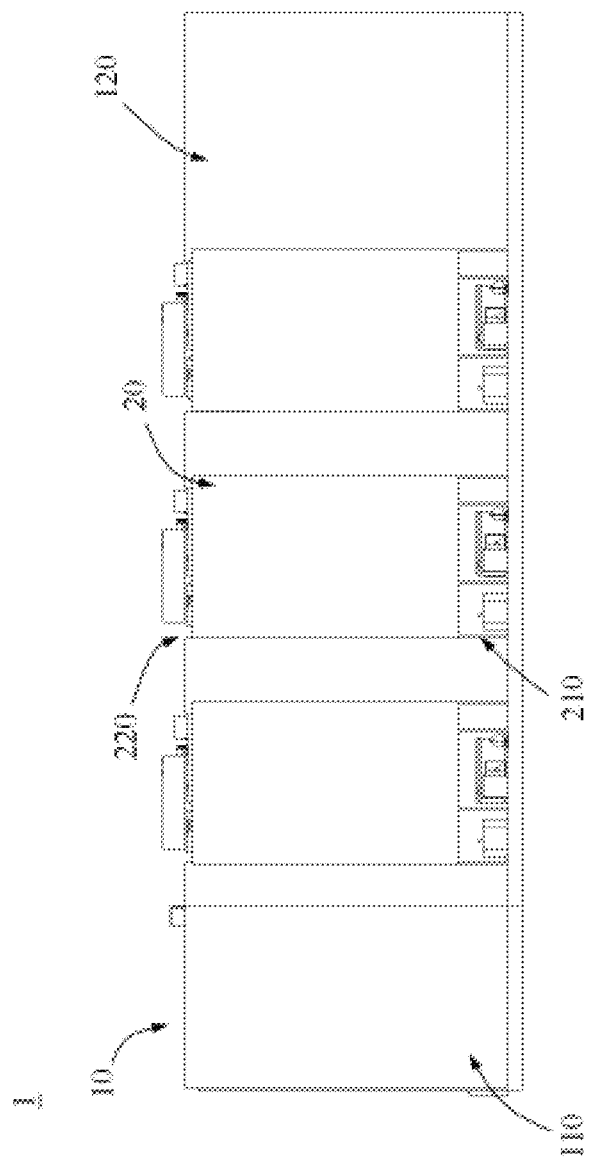
FIG. 2 is a schematic side view of the example data center system according to the first example embodiment of the present disclosure.

As shown in FIG. 1 and FIG. 2, a data center system 1 disclosed in the first example embodiment of the present disclosure includes an infrastructure unit 10 and at least one computer room 20. The infrastructure unit 10 is used as an infrastructure to support one or more computer rooms 20, and accommodates therein a monitoring device for monitoring the operation of the computer room 20, a maintenance device or other device. The infrastructure unit 10 includes a public area 110 and a bridge area 120; and the monitoring device, maintenance device or other device as mentioned above is accommodated in the public area 110. One side of the bridge area 120 is connected to the public area 110, and the other side extends toward a direction away from the public area 110. The one or more computer rooms 20 are disposed along an extending direction of the bridge area 120, and are connected to the bridge area 120, wherein there is an angle between the public area 110 and the bridge area 120, and an assembly area is defined in the range of such angle. The computer room 20 may be, but is not limited to being, disposed in the assembly area formed between the public area 110 and the bridge area 120, and may correspond to the public area 110, which is used to maintain the integrity of the structural appearance of the data center system 1, so that the number of computer rooms 20 to be configured for the data center system 1 per unit area may reach an optimal value, thereby improving the utilization per unit area. Furthermore, a connecting passage 121 is further provided in the bridge area 120 of the infrastructure unit 10. The connecting passage 121 is in connection with internal space of the public area 110 and internal space of the computer room 20, and is used as a maintenance passage for the maintenance of the device inside the computer room 20.

It should be noted that in the present disclosure, a length of the bridge area 120 of the infrastructure unit 10 is matched with a length of the computer rooms 20 disposed along the bridge area 120, which means that the length of the bridge area 120 is proportional to the number of computer rooms 20 that are disposed; and in an initial state, the length of the bridge area 120 is a multiple of the number of computer rooms 20 that are disposed. For example, in an initial planning of the data center system, only one computer room 20 needs to be used, and in this case, it may be considered that the number of computer rooms 20 that are disposed in the initial state is one, and the length of the bridge area 120 is at least the length of N+1 compute rooms 20 that are disposed along the bridge area 120 and arranged along a side edge of the bridge area 120; or the length of (N+ any another integer) computer rooms 20 that are arranged along the bridge area 120, wherein N is the number of computer rooms 20 that are disposed in the initial state.

In other words, in the initial state, the bridge area 120 is adapted to connect a plurality of computer rooms 20, and by using such a configuration for redundant length (as shown by dashed lines in FIG. 1), the data center system 1 may expand the number of computer rooms 20 with the infrastructure unit 10 according to the use needs. Since the plurality of computer rooms 20 may share pre-built facilities or pre-configured device in the infrastructure unit 10, the overall data processing capability of the data center system 1 may be increased to meet the use needs by simply increasing the number of computer rooms 20 along the extending direction of the bridge area 120, without rebuilding the infrastructure unit 10, which makes the application of the data center system 1 quite flexible and convenient.

Figure 3:
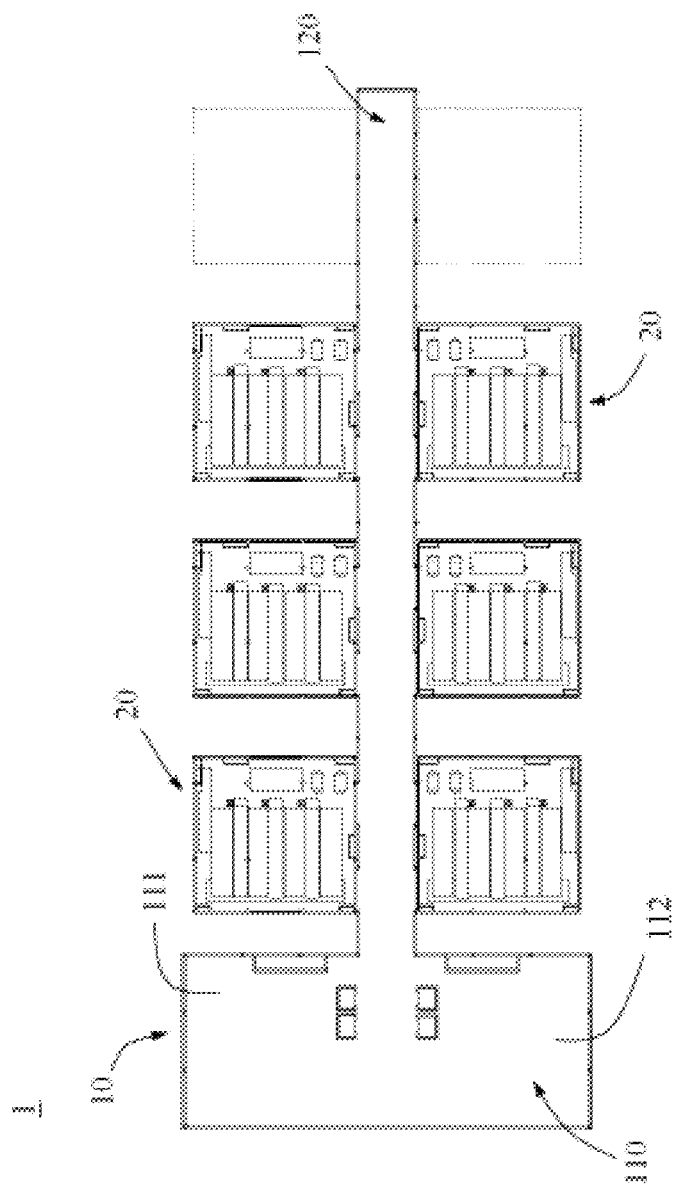
FIG. 3 is a schematic top view of an example data center system according to another example embodiment of the present disclosure.

In addition, as shown in FIG. 3, in another example embodiment of the present disclosure, the public area 110 of the infrastructure unit 10 may further include a plurality of subareas, for example, including an office area 111 and a device area 112. The device area 112 is equipped with the monitoring device as mentioned above and is divided into functional accommodation spaces such as a high-voltage power distribution room and a warehouse. The bridge area 120 of the infrastructure unit 10 is connected between the office area 111 and the device area 112, and the bridge area 120 forms assembly areas between the office area 111 and the device area 112 respectively, so that the computer room 20 may be selectively disposed on one side of the bridge area 120 corresponding to the public area 110. For example, the computer room 20 may be disposed between the office area 111 and the bridge area 120 and correspond to the office area 111. Alternatively, the computer room 20 may be disposed between the device area 112 and the bridge area 120 and correspond to the device area 112. Moreover, when the number of computer rooms 20 that is disposed is more than one, the computer rooms 20 may be symmetrically disposed on two opposite sides of the bridge area 120, which may not only maintain the integrity of the structural appearance of the data center system 1, but also expand a considerable number of computer rooms 20 according to the use needs and make the application quite flexible and convenient.

As shown in FIG. 1, FIG. 2, FIG. 4 and FIG. 5, in the data center system 1 disclosed in the first example embodiment of the present disclosure, the computer room 20 includes a plurality of data centers 230, and the plurality of data centers 230 form a multilayer structure in the computer room 20 in a stacked mode. Furthermore, a bottom layer 210 and a top layer 220 may further be selectively disposed in the computer room 20; and the bottom layer 210 is used as a base layer, and then the plurality of data centers 230 and the top layer 220 are disposed on the bottom layer 210 in sequence, so that the plurality of data centers 230 is configured in a multilayer form between the bottom layer 210 and the top layer 220, wherein the number of data centers 230 located between the bottom layer 210 and the top layer 220 may be set according to the actual needs. For example, only one data center 230 is disposed between the bottom layer 210 and the top layer 220 and is disposed in a single-layer form between the bottom layer 210 and the top layer 220; or two, five or ten layers of data centers 230 stacked on each other are disposed.

The example embodiment is described in a case of five layers of data centers 230 being disposed between the bottom layer 210 and the top layer 220, but the present disclosure is not limited thereto. Furthermore, a height of the infrastructure unit 10 of the data center system 1 is matched with a height of the computer room 20. For example, the height of the bridge area 120 of the infrastructure unit 10 is equal to the total height of the bottom layer 210 and the data centers 230 of the computer room 20. Therefore, when the computer room 20 is connected to the bridge area 120, the bridge area 120 is connected to the bottom layer 210 and the data centers 230 of the computer room 20 respectively, and is in connection with the internal space of the bottom layer 210 and each layer of data center 230 through the connecting passage 121. The top surface of the bridge area 120 corresponds to and connects to the top layer 220 of the computer room 20. Therefore, in a working scenario, working personnel may enter into the bottom layer 210 and each layer of data center 230 of the computer room 20 from the bridge area 120 through the connecting passage 121, and enter into the top layer 220 of the computer room 20 through the connecting passage 121 and the top surface to perform various device maintenance operations or perform other work.

Figure 4:
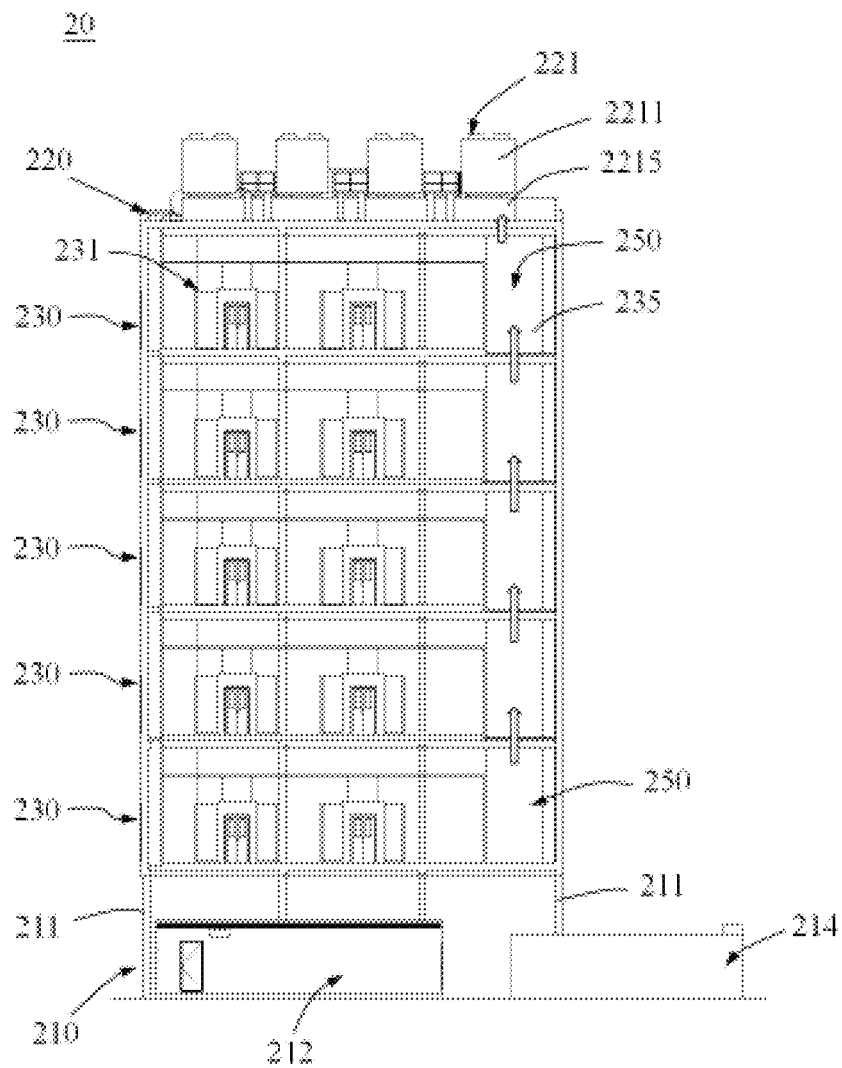
FIG. 4 is a schematic side view of an example computer room according to the first example embodiment of the present disclosure.
Figure 5:
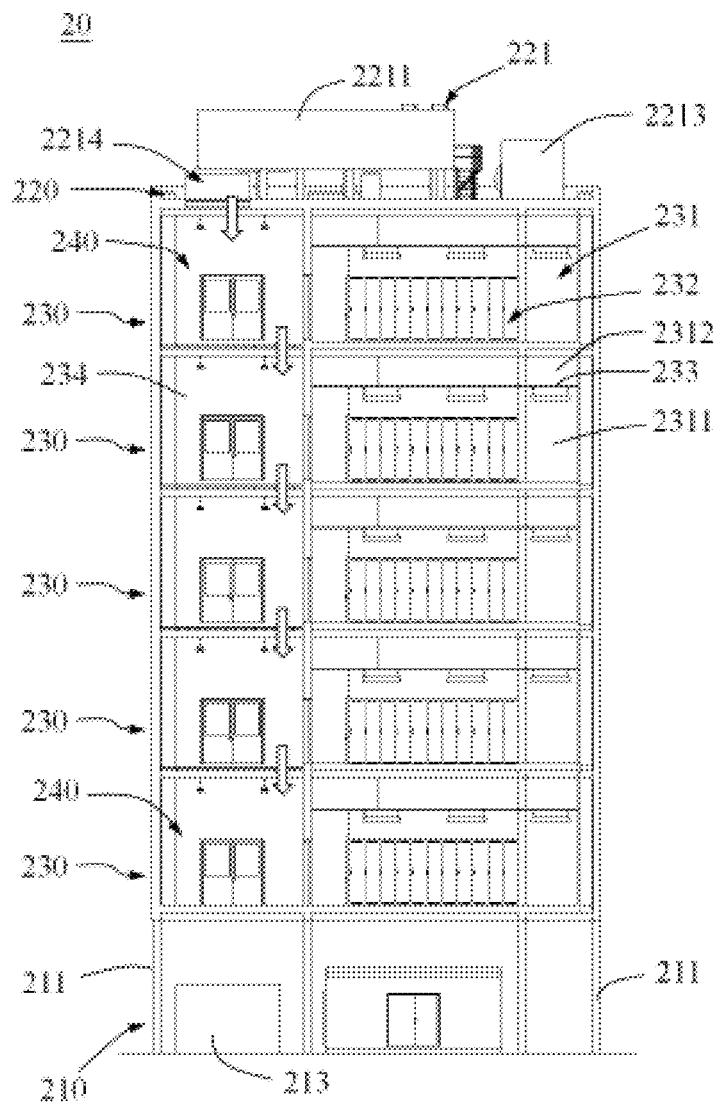
FIG. 5 is a schematic side view of the example computer room from another viewing angle according to the first example embodiment of the present disclosure.
Figure 6:
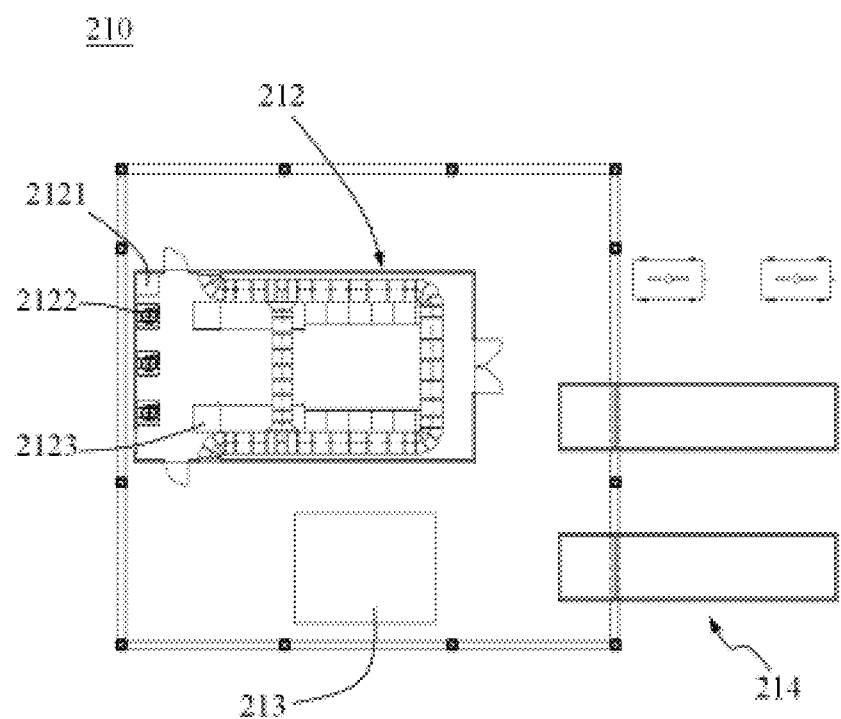
FIG. 6 is a schematic plan view of a bottom layer of the example computer room according to the first example embodiment of the present disclosure.

Referring to FIG. 4 to FIG. 6, the bottom layer 210 of the computer room 20 is used as an electrical support area of the computer room 20. Support columns 211 are disposed at intervals around the bottom layer 210, and an opening is formed between two neighboring support columns 211, so that the bottom layer 210 forms an open space that communicates the internal environment with the external environment. A power distribution module 212 and/or a firefighting module 213 or the like may be selectively disposed in the bottom layer 210, and an electricity generator set 214, for example, an electricity generator set including a 1800/2000 kW low-voltage electricity generator and an oil storage tank, is further connected to one side edge of the bottom layer 210. The power distribution module 212 may be, but not limited to, formed by combining a plurality of containers, for example, formed by combining 3 containers that comply with ISO standards, and the devices such as a gaseous firefighting without piping system (for example, FM200) 2121, a wall-mounted or floor-mounted precision air conditioner 2122 and a power distribution cabinet 2123 are disposed in the power distribution module 212. The power distribution cabinet 2123 includes a 10 kV input cabinet, a 2000-2500 kW dry-type transformer, an ATS power distribution cabinet, a low-voltage power distribution cabinet, and so on. Moreover, when a plurality of power distribution cabinets 2123 is disposed in the power distribution module 212, the plurality of power distribution cabinets 2123 may be pre-integrated in the two outermost containers in a paired mirror-image layout mode, so that the containers in the middle may be used as maintenance passages for the power distribution cabinets 2123 on the two sides. Furthermore, the power distribution module 212 may also use a UPS centralized power supply mode, and a corresponding UPS, battery or the like is built or integrated in the power distribution module 212.

Based on the above, since the power distribution module 212 may be formed by combining a plurality of containers, and the power distribution cabinets 2123 and relevant devices may be pre-integrated therein, such a combination may be made in the bottom layer 210 directly according to the use needs of different disposable numbers and amount of electricity to complete a delivery. The firefighting module 213 may use a configuration of high-pressure water mist or gaseous firefighting, and a corresponding firefighting device is pre-integrated in the firefighting module 213, and then a corresponding number of firefighting modules 213 are disposed in the bottom layer 210 according to the needs. Therefore, the construction of the bottom layer 210 of the computer room 20 and the configuration of the overall power supply system are flexible and quick.

Figure 7:
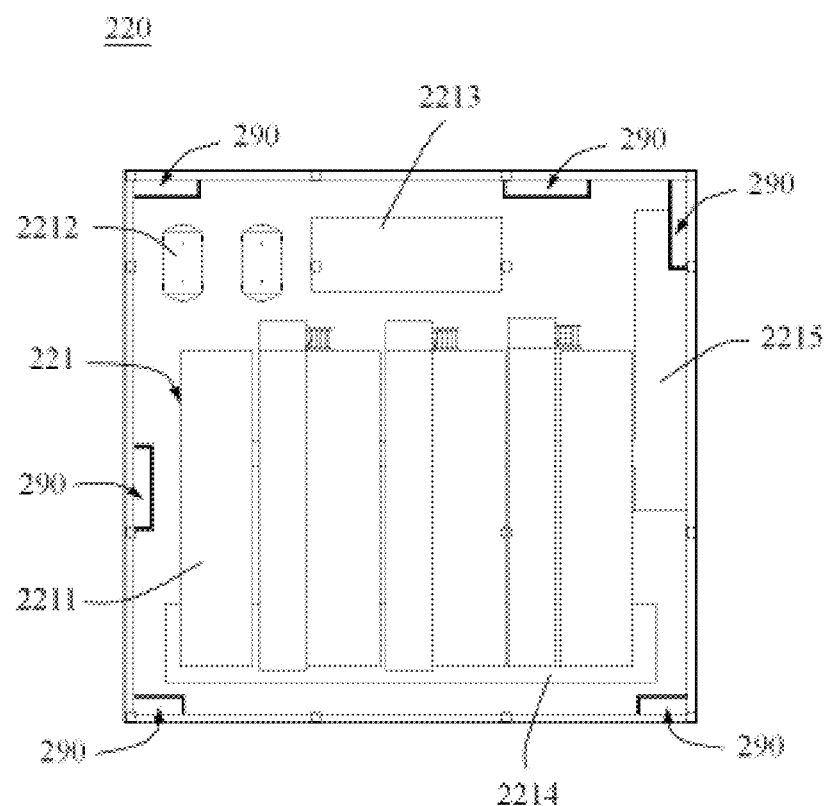
FIG. 7 is a schematic plan view of a top layer of the example computer room according to the first example embodiment of the present disclosure.

Referring to FIG. 4, FIG. 5 and FIG. 7, the top layer 220 of the computer room 20 is equipped with a cooling module 221, which is used as a mechanical cooling support area of the computer room 20. The cooling module 221 includes one or more air handling units (AHU) 2211, a water tank 2212 and a water pump module 2213, and the like. The air handling unit 2211 may be, but not limited to, an air handling unit that is compatible with a rotary heat exchange unit, indirect air-air heat exchange, evaporative heat dissipation, direct-expansion or cooler module. Moreover, a dual power input mode may be implemented by disposing an automatic transfer switch (ATS) inside the air handling unit; or a flexible adjustment of different data center availability tiers may be implemented by configuring a UPS.

Each of the air handling units 2211 is connected to the water tank 2212 and the water pump module 2213 through a liquid delivery pipe, and the air handling units 2211 are connected to a supply air duct 2214 and a return air duct 2215. The supply air duct 2214 and the return air duct 2215 respectively runs through the bottom surface of the top layer 220 and are in connection with the data center 230.

Referring to FIG. 4, FIG. 5, and FIG. 8 to FIG. 10, the data center 230 of the computer room 20 is equipped with a main computer room area 231 for IT device and/or network device, which is used to accommodate one or more server racks 232. The main computer room area 231 is a separate isolated area in the data center 230, and a separation plate 233 having an opening is disposed in the main computer room area 231 along a horizontal direction of the data center 230 to separate the inside of the main computer room area 231 into an accommodation space 2311 at a lower layer and an air exhaust passage 2312 at an upper layer. The accommodation space 2311 is used to accommodate one or more server racks 232. These server racks 232 are connected, through air exhaust pipes, to positions on the separation plate 233 that correspond to the opening, and thus are in connection with the air exhaust passage 2312 at the upper layer.

Furthermore, the space in the data center 230 that is outside the main computer room area 231 is further divided into a cold passage area 234 and a hot passage area 235. The cold passage area 234 and the hot passage area 235 may be located respectively on two opposite sides of the main computer room area 231 or located on two adjacent sides of the main computer room area 231, and isolated from each other by disposing a stop wall. The example embodiment describes that the cold passage area 234 and the hot passage area 235 are respectively located on two adjacent sides of the main computer room area 231, but the present disclosure is not limited thereto. Moreover, the accommodation space 2311 of the main computer room area 231 is at least isolated from the hot passage area 235, and the air exhaust passage 2312 is in connection with the hot passage area 235 and isolated from the cold passage area 2311.

It should be noted that the bottom surface of the data center 230 that is located in the cold passage area 234 and the hot passage area 235 is equipped with hollow structures 236 that run through the bottom surface respectively, so that the cold passage areas 234 and the hot passage areas 235 of each data center 230 are in connection with each other through the hollow structures 236 respectively to form a plurality of airflow passages in the computer room 20 along a direction from the top layer 220 toward the bottom layer 210 (or from the bottom layer 210 toward the top layer 220), which include a cold air passage 240 for directing the flow of cold air and a hot air passage 250 for directing the flow of hot air. Wherein, the cold passage area 234 of the data center 230 at the topmost layer is in connection with the supply air duct 2214 of the top layer 220, so that the cold passage areas 234 that are in connection with each other between the plurality of layers of data centers 230 form the cold air passage 240 in the computer room 20, which is used to receive cold air produced by the air handling unit 2211 (as shown by hollow arrows in FIG. 5). The hot passage area 235 is in connection with the return air duct 2215 of the top layer 220, so that the hot passage areas 235 that are in connection with each other among the plurality of layers of data centers 230 form the hot air passage 250 in the computer room 20, which is used to direct the hot air in the data center 230 to flow to the air handling unit 2211 for cooling. Especially, the hot air produced by the server racks 232 in the main computer room area 231 (as shown by hollow arrows in FIG. 4) may be directed to the hot air passage 250 through the air exhaust passage 2312 in the main computer room area 231, and then transported through the hot air passage 250 and the return air duct 2215 to the air handling unit 2211 for the cooling.

Figure 9:
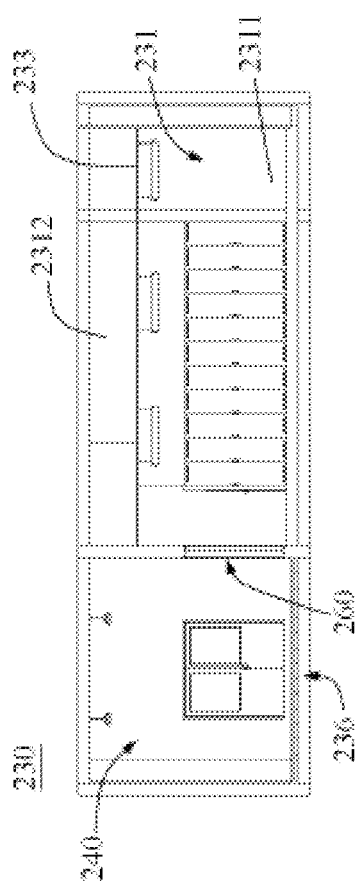
FIG. 9 is a schematic side view of the data center of the example computer room according to the first example embodiment of the present disclosure.
Figure 10:
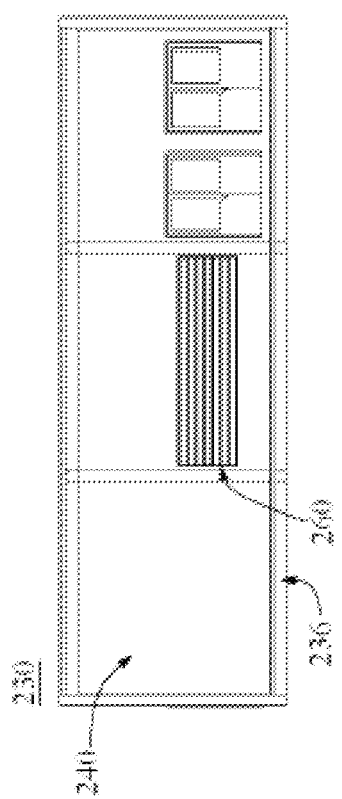
FIG. 10 is a schematic side view of the data center of the example computer room from another viewing angle according to the first example embodiment of the present disclosure.

In the computer room 20, in order to facilitate the temperature adjustment in the main computer room area 231 of the data center 230, the cold passage area 234 of the data center 230 may be isolated from the accommodation space 2311 of the main computer room area 231 by disposing a wall surface, and a cold air valve 260 is disposed on the wall surface (as shown in FIG. 9 and FIG. 10); moreover, a corresponding temperature control unit is disposed in the data center 230. Therefore, the accommodation space 2311 may be in connection with or isolated from the cold air passage 240 by turning on or off the cold air valve 260, and when the temperature of the accommodation space 2311 of the main computer room area 231 exceeds a preset value, the temperature in the accommodation space 2311 may be adjusted by controlling the open degree of the cold air valve 260.

Based on the above structure, with the vertical distribution of the cold air passage 240 and the hot air passage 250 in the computer room 20 along the direction from the top layer 220 toward the bottom layer 210, the cooling module 212 disposed on the top layer 220 may supply cold air to one or more data centers 230 at the same time through the cold air passage 240, and direct hot air from one or more data centers 230 to the cooling module 212 through the hot air passage 250 to form a cooling circulation system in the computer room 20 that may be used in a multilayer structure, which may not only provide a cooling function to various layers in the computer room 20, but also dispose a corresponding number of layers of data centers 230 stacked on each other in the computer room 20 according to the use needs to increase the number of server racks 232 to improve the data processing capability and performance of the computer room 20. Furthermore, with such configuration, different cooling technologies may be used on the top layer 220 of the computer room 20 according to different use needs and different forms of cooling modules 212 may be disposed to make full use of the cooling module 212 and reduce the power consumption.

Figure 8:
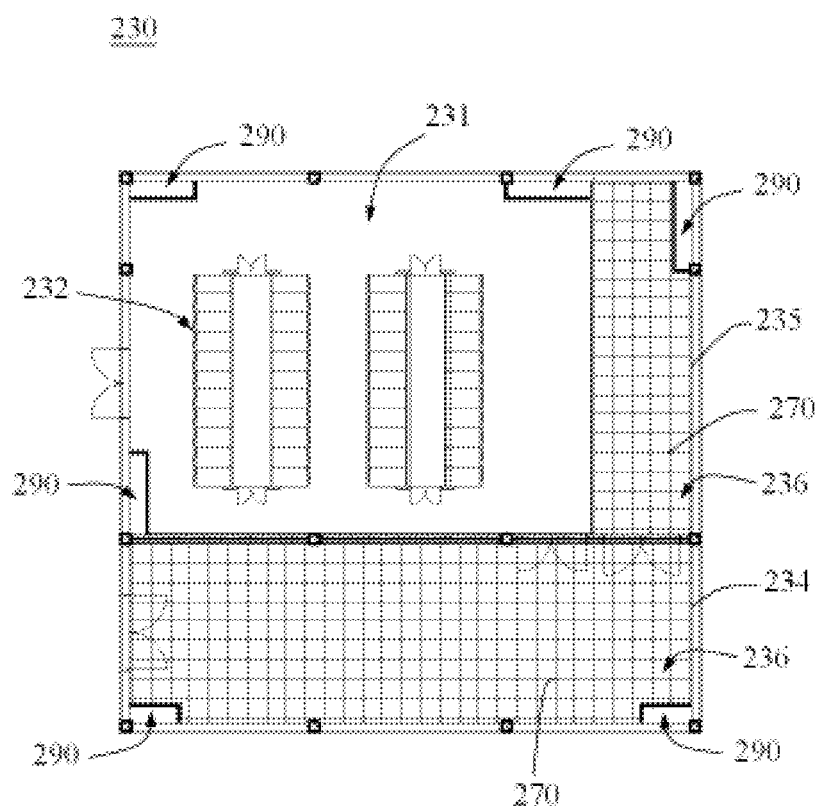
FIG. 8 is a schematic plan view of a data center of the example computer room according to the first example embodiment of the present disclosure.
Figure 11:
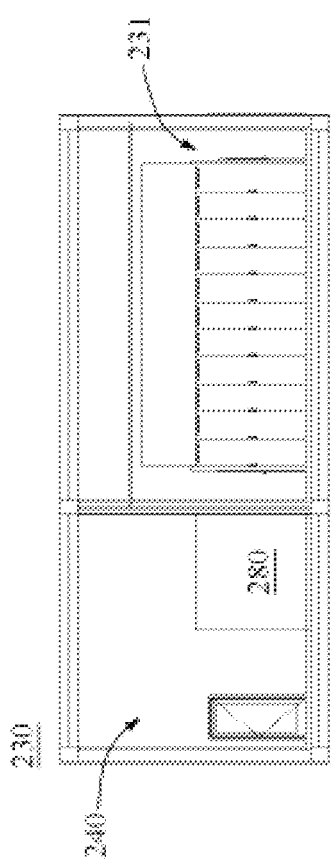
FIG. 11 is a schematic view of a use state of the data center of the example computer room according to the first example embodiment of the present disclosure.

Furthermore, in the process of transporting the cold air and hot air through the cold air passage 240 and the hot air passage 250 respectively, in order to enable the cold air and hot air to stably flow in corresponding airflow passages, grills 270 may further be disposed on the hollow structures 236 in the data center 230 that correspond to the cold air passage 240 and the hot air passage 250 (as shown in FIG. 4, FIG. 5 and FIG. 8) respectively. The grill 270 may be, but not limited to, a perforated steel plate to provide a function of reducing dynamic airflow pressure and increasing static airflow pressure. Meanwhile, disposing such grills 270 may effectively uses the bottom surface area of the data center 230. For example, not only these grills 270 may be used as maintenance passages for working personnel to access the data center 230, but also other firefighting device or power supply device 280 (as shown in FIG. 11) may be disposed on the grill 270 that corresponds to the cold air passage 240 according to the use needs. For example, an approximate 300 kW AC/DC UPS, a corresponding input/output power distribution cabinet or battery cabinet or the like may be disposed. Therefore, when the cold air passage 240 transports the cold air to provide a cooling function for the IT device in the main computer room area 231, the power supply device 280 that generates lots of heat during such an operation may also be cooled, which is a double benefit. Certainly, these power supply device 280 may also be disposed in the bottom layer in a centralized mode, or disposed in the data center 230 as an auxiliary device.

By using such a configuration, the power distribution level and the UPS technology may be flexibly set for each layer in the computer room 20, and a switching between data center availability tiers 1 to 4 (Tier 1 to Tier 4) may be implemented, thereby achieving a combination of power distribution levels that comply with different data center availability tiers in one computer room 20. For example, in the multilayer structure, one mains supply and one AC UPS may be equipped at the bottom layer 210; one mains supply and one DC UPS may be equipped at the second layer (that is, the first layer of data center 230); two AC UPSs may be equipped at the third layer; two DC UPSs may be equipped at the fourth layer, . . . , and one AC UPS and one DC UPS may be provided at the top layer 220.

Referring to FIG. 2, FIG. 7 and FIG. 8, it should be noted that in the computer room 20 as disclosed in the example embodiment, a plurality of piping shafts 290 are further disposed around the computer room 20 respectively, and are isolated from the main computer room area 231, the cold passage area 234, and the hot passage area 235 in the data center 230 respectively. Meanwhile, when a plurality of data centers 230 are stacked on each other, the piping shafts 290 run through the top layer 220, the data center 230, and the bottom layer 210 along a direction from the top layer 220 toward the bottom layer 210 for laying piping such as electricity, network or water pipes therein. For example, when the number of piping shafts is 6, dual networks, dual power supplies and dual water supplies may be configured to meet physical isolation requirements on dual power supplies/networks/water supplies of the data center availability tier 4. Furthermore, corresponding configurations may be used according to the requirements of different data center availability tiers, which provide high flexibility in use.

Figure 12:
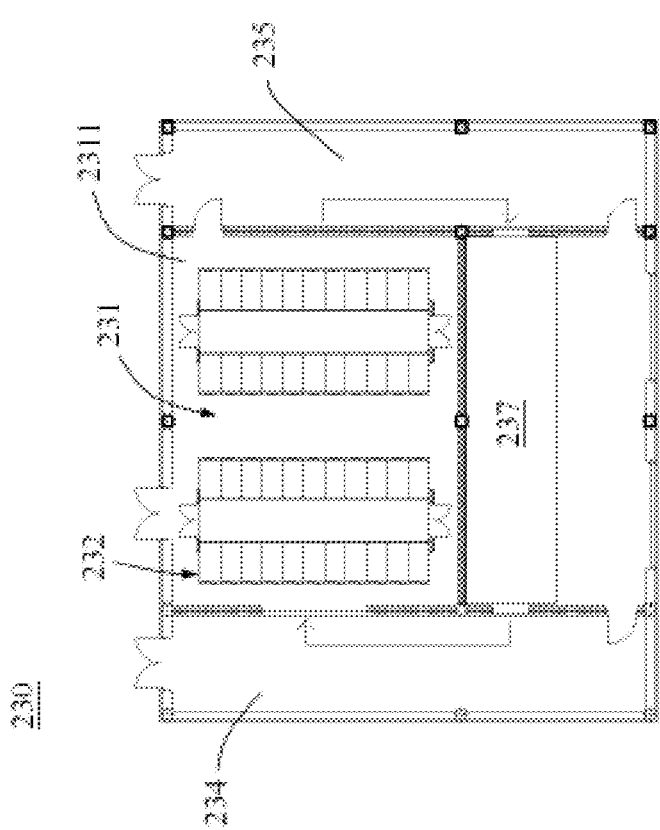
FIG. 12 is a schematic partial side view of an example computer room according to the second example embodiment of the present disclosure.
Figure 13:
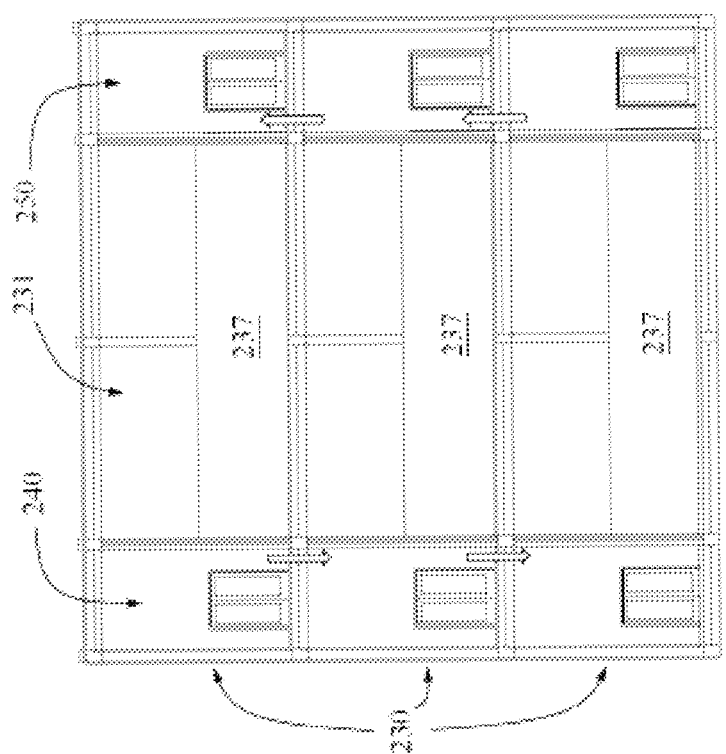
FIG. 13 is a schematic plan view of an example data center of the example computer room according to the second example embodiment of the present disclosure.

As shown in FIG. 12 and FIG. 13, the computer room disclosed in the second example embodiment of the present disclosure is substantially the same as the computer room in the first example embodiment in terms of the structure, and the difference therebetween lies in that in the computer room disclosed in the second example embodiment, the cold passage area 234 and the hot passage area 235 located in the data center 230 are disposed respectively on two opposite sides of the main computer room area 231, so that the cold air passage 240 and the hot air passage 250 are formed respectively on two opposite sides of the computer room 20.

Moreover, an air conditioning module 237 may further be selectively disposed outside the main computer room area 231 of the data center 230. The air conditioning module 237 is disposed between the cold passage area 234 and the hot passage area 235 and is isolated from the main computer room area. The air conditioning module 237 includes an air outlet and an air inlet that are opposite to each other, and the air outlet and the air inlet are connected to the cold passage area 234 and the hot passage area 235 respectively, so that the air outlet is in connection with the cold air passage 240 and the air inlet is in connection with the hot air passage 250. Therefore, when the air conditioning module 237 operates, the cold air produced thereby may be transported into the accommodation space 2311 of the main computer room area 231 through the cold air passage 240 (as shown by an arrow in the cold passage area 234 in FIG. 12) to provide a cooling function for the server racks 232, and the hot air produced by the server racks 232 may be transported back into the air conditioning module 237 through the hot air passage 250 (as shown by an arrow in the hot passage area 235 in FIG. 12) and turned into the cold air by the air conditioning module 237.

By using such a configuration, electro-mechanical systems may be disposed in the computer room, and the vertical cooling mode formed in the computer room by the cold air passage 240 and the hot air passage 250 enables the air conditioning modules 237 distributed at different layers to collaborate with each other, thereby reducing the power consumption and improving the cooling efficiency.

Several example embodiments of the present disclosure have been illustrated and described. As mentioned above, it should be understood that the present disclosure is not limited to the disclosed example embodiments, should not be construed as excluding other embodiments, and may be applied to other combinations, modifications and environments and altered in view of the above teaching, techniques or knowledge in relevant techniques within the invention concept of the present disclosure. Any alteration and change made by those skilled in the art that do not depart from the spirit and scope of the present disclosure belong to the protection scope of the appended claims of the present disclosure.

What is claimed is:

1. A computer room comprising:
a plurality of layers of data centers, each layer of the plurality of layers of data centers comprising:
a main computer room area including a separation plate having an opening, the separation plate being disposed along a horizontal direction of the main computer room area separating the main computer room area into an accommodation space at a lower layer and an air exhaust passage at an upper layer, the accommodation space being connected with the air exhaust passage through the opening;
a cold passage area disposed on a side of the main computer room area, the cold passage area being connected with the accommodation space;
a hot passage area disposed on another side of the main computer room area, the hot passage area being connected with the air exhaust passage and isolated from the cold passage area; and
a plurality of hollow structures corresponding to the cold passage area and the hot passage area respectively,
wherein:
the cold passage areas of two neighboring layers of data centers are in connection with each other through a corresponding hollow structure of the plurality of hollow structures, which forms a cold air passage running through the plurality of layers of data centers in the computer room; and
the hot passage areas of two neighboring layers of data centers are in connection with each other through another corresponding hollow structure of the plurality of hollow structures, which forms a hot air passage running through the plurality of layers of data centers in the computer room.

2. The computer room of claim 1, further comprising a top layer disposed above the plurality of layers of data centers and equipped with a cooling module, the cooling module including a supply air duct and a return air duct, the supply air duct being connected with the cold air passage, the return air duct being connected with the hot air passage, the cooling module providing cold air to the plurality of layers of data centers through the cold air passage and recycling hot air from the plurality of layers of data centers through the hot air passage.

3. The computer room of claim 2, further comprising a bottom layer, the plurality of layers of data centers being disposed between the bottom layer and the top layer, the bottom layer being equipped therein with a power distribution module, the power distribution module being electrically connected to the plurality of layers of data centers.

4. The computer room of claim 3, wherein the bottom layer further comprises a firefighting module.

5. The computer room of claim 1, wherein:
a cold air valve is disposed between the main computer room area and the cold passage area; and
the main computer room area is in connection with or isolated from the cold passage area by turning on or off the cold air valve.

6. The computer room of claim 1, wherein the plurality of hollow structures is disposed on a top surface or a bottom surface of each layer of the plurality of layers of data centers, and a grill is disposed on at least one of the plurality of hollow structures.

7. The computer room of claim 6, wherein each layer of the plurality of layers of data centers is further equipped with a power supply device, the power supply device being disposed in the cold passage area and placed on the grill.

8. The computer room of claim 1, wherein:
each layer of the plurality of layers of data centers is further equipped with an air conditioning module;
the cold passage area and the hot passage area are disposed on two opposite sides of the main computer room area respectively; and
the air conditioning module is isolated from the main computer room area, and connected to the cold passage area and the hot passage area, the air conditioning module configured to turn hot air from the hot passage area into cold air and to discharge the cold air into the cold passage area.

9. The computer room of claim 1, wherein each layer of the plurality of layers of data centers further comprises a plurality of piping shafts disposed around each layer of the plurality of layers of data centers and isolated from the main computer room area, the cold passage area and the hot passage area.

10. A computer room comprising:
a top layer;
a bottom layer; and
a data center disposed between the top layer and the bottom layer, the data center comprising:
a main computer room area including a separation plate having an opening, the separation plate disposed along a horizontal direction of the main computer room area separating the main computer room area into an accommodation space at a lower layer and an air exhaust passage at an upper layer, the accommodation space being connected with the air exhaust passage through the opening;
a cold passage area disposed on a side of the main computer room area, the cold passage area being connected with the accommodation space;
a hot passage area disposed on another side of the main computer room area, the hot passage area being connected with the air exhaust passage and isolated from the cold passage area; and
a plurality of hollow structures corresponding to the cold passage area and the hot passage area respectively.

11. The computer room of claim 10, wherein the top layer comprises a cooling module, the cooling module including a supply air duct and a return air duct, the supply air duct being connected with the cold passage area, the return air duct being connected with the hot passage area, the cooling module providing cold air to the data center through the cold air passage and recycling hot air from the data center through the hot air passage.

12. The computer room of claim 10, wherein the bottom layer comprises a power distribution module, the power distribution module being electrically connected to the data center.

13. The computer room of claim 12, wherein the bottom layer further comprises a firefighting module.

14. The computer room of claim 10, wherein:
a cold air valve is disposed between the main computer room area and the cold passage area; and
the main computer room area is in connection with or isolated from the cold passage area by turning on or off the cold air valve.

15. The computer room of claim 10, wherein:
the data center is further equipped with an air conditioning module;
the cold passage area and the hot passage area are disposed on two opposite sides of the main computer room area respectively; and
the air conditioning module is isolated from the main computer room area, and connected to the cold passage area and the hot passage area, the air conditioning module configured to turn hot air from the hot passage area into cold air and to discharge the cold air into the cold passage area.

16. A computer room for providing a vertical cooling circulation to data centers, the computer room comprising:
a plurality of data centers layered upon each other, each of the plurality of data centers comprising:
a main computer room area including a separation plate having an opening, the separation plate disposed along a horizontal direction of the main computer room area separating the main computer room area into an accommodation space at a lower layer and an air exhaust passage at an upper layer, the accommodation space being connected with the air exhaust passage through the opening;
a cold passage area disposed on a side of the main computer room area, the cold passage area being connected with the accommodation space;
a hot passage area disposed on another side of the main computer room area, the hot passage area being connected with the air exhaust passage and isolated from the cold passage area; and
a plurality of hollow structures corresponding to the cold passage area and the hot passage area respectively,
wherein:
the cold passage areas of two neighboring layers of data centers are in connection with each other through a corresponding hollow structure of the plurality of hollow structures, which forms a cold air passage running through the plurality of data centers in the computer room; and
the hot passage areas of two neighboring layers of data centers are in connection with each other through another corresponding hollow structure of the plurality of hollow structures, which forms a hot air passage running through the plurality of data centers in the computer room;
a top layer disposed above the plurality of data centers, the top layer equipped with a cooling module, the cooling module including a supply air duct and a return air duct, the supply air duct being connected with the cold air passage, the return air duct being connected with the hot air passage, the cooling module providing cold air to the plurality of data centers through the cold air passage and recycling hot air from the plurality of data centers through the hot air passage; and
a bottom layer disposed under the plurality of data centers, the bottom layer equipped therein with a power distribution module, the power distribution module electrically connected to the plurality of layers of data centers.

17. The computer room of claim 16, wherein:
a cold air valve is disposed between the main computer room area and the cold passage area; and
the main computer room area is in connection with or isolated from the cold passage area by turning on or off the cold air valve.

18. The computer room of claim 16, wherein:
the plurality of hollow structures is disposed on a top surface or a bottom surface of each data center of the plurality of data centers, and a grill is disposed on at least one of the plurality of hollow structures, and
each data center of the plurality of data centers is further equipped with a power supply device, the power supply device being disposed in the cold passage area and placed on the grill.

19. The computer room of claim 16, wherein:
each data center of the plurality of data centers is further equipped with an air conditioning module;
the cold passage area and the hot passage area are disposed on two opposite sides of the main computer room area respectively; and
the air conditioning module is isolated from the main computer room area, and connected to the cold passage area and the hot passage area, the air conditioning module configured to turn hot air from the hot passage area into cold air and to discharge the cold air into the cold passage area.

20. The computer room of claim 16, wherein each data center of the plurality of data centers further comprises a plurality of piping shafts disposed around the respective data center and isolated from the main computer room area, the cold passage area and the hot passage area.

* * * * *